(12) United States Patent
Shih (10) Patent No.: US 7,719,853 B2
(45) Date of Patent: May 18, 2010

(54) ELECTRICALLY CONNECTING TERMINAL STRUCTURE OF CIRCUIT BOARD AND MANUFACTURING METHOD THEREOF

(75) Inventor: Chao-Wen Shih, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 527 days.

(21) Appl. No.: 11/781,086

(22) Filed: Jul. 20, 2007

(65) Prior Publication Data
US 2008/0020602 A1    Jan. 24, 2008

(30) Foreign Application Priority Data
Jul. 20, 2006    (TW) ............................... 95126474 A (51) Int. Cl.
H05K 7/00    (2006.01)

(52) U.S. Cl. .................. 361/767; 361/760; 361/761; 174/262; 438/614; 438/622

(58) Field of Classification Search ......... 174/260–266, 174/250, 255–257, 259; 361/760–761, 767, 361/768, 808; 439/67; 438/612–615, 648, 438/652, 656, 674, 687, 614, 622; 257/638, 257/698, 737, 738, 786, 734, 780
See application file for complete search history.

(56) References Cited

U.S. PATENT DOCUMENTS

| 5,436,412 A * | 7/1995 | Ahmad et al. ................ 174/262 |
| 2004/0160751 A1* | 8/2004 | Inagaki et al. ............... 361/763 |
| 2005/0039948 A1* | 2/2005 | Asai et al. .................... 174/262 |
| 2005/0217894 A1* | 10/2005 | Pan ............................. 174/260 |

* cited by examiner

Primary Examiner—Dameon E Levi
Assistant Examiner—Hoa C Nguyen
(74) Attorney, Agent, or Firm—Sawyer Law Group, P.C.

(57) ABSTRACT

An electrically connecting terminal structure of a circuit board and a manufacturing method thereof are disclosed. The method includes: providing a circuit board defined with first and second predetermined areas; forming the first electrically connecting pad in the first predetermined area and the second electrically connecting pad in a portion of the second predetermined area; forming an insulated protecting layer on the circuit board, forming openings on the insulated protecting layer for exposing the first and second electrically connecting pads and a pad-uncovered portion of the second predetermined area; forming a conductive layer on the insulated protecting layer and forming openings of the insulated protecting layer; forming a resist on the conductive layer, forming openings on the resist above the openings of the insulated protecting layer; and forming first and second metals in the openings above the first and second electrically connecting pads and the pad-uncovered portion of the second predetermined area.

16 Claims, 6 Drawing Sheets

ELECTRICALLY CONNECTING TERMINAL STRUCTURE OF CIRCUIT BOARD AND MANUFACTURING METHOD THEREOF

BACKGROUND OF THE INVENTION

1. Field of the Invention

The present invention relates to electrically connecting terminal structures for a circuit board and a manufacturing method of the structures, and more particularly, to a method for manufacturing an electrically connecting terminal structure of a circuit board by electroplating.

2. Description of the Prior Art

Flip chip package technology was introduced into the industry by IBM in the early 1960s. Unlike wire bonding technology, flip chip package technology involves implementing electrical connection between a semiconductor chip and a circuit board by solder bumps instead of gold wires. Flip chip package technology spares the use of long gold wires and thereby enables reduction of impedance. In view of this, the technique of applying high-temperature solder to a ceramic substrate, or control collapse chip connection (i.e., "C4"), has been in use for years. Recent years saw an increasing demand for high-density, high-speed, low-cost semiconductor components and a trend toward miniaturization of electronic products, and thus there is explosive growth in installing flip-chip components in low-cost circuit boards and disposing resin underfill beneath a chip to decrease the thermal stress resulting from a thermal expansion difference between a chip and an organic circuit board.

With the existing flip chip technology, an integrated circuit (IC) chip is equipped with electrode pads that match electrically connecting pad of an organic circuit board, and solder bumps or any other conductive surface-mounted materials can be disposed between the chip and the circuit board as appropriate, and thus the solder bumps or the other conductive surface-mounted materials provide electrical input/output (I/O) and mechanic connection between the chip and the circuit board.

Figure 1:
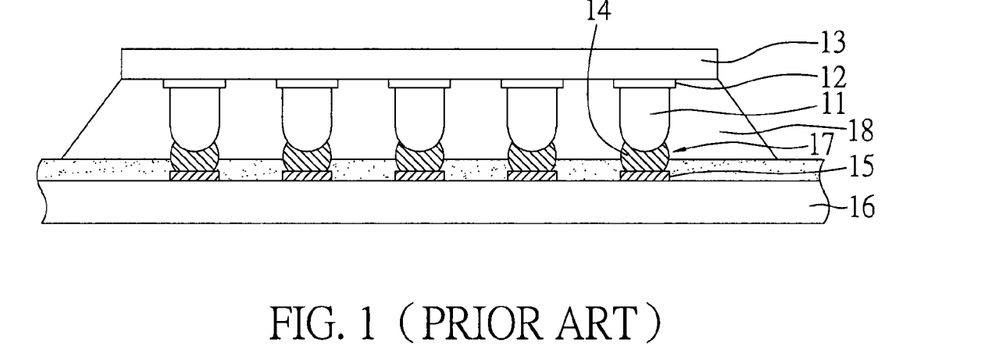
FIG. 1 (PRIOR ART) is a cross-sectional view showing a conventional flip-chip component.

As shown in FIG. 1, flip chip technology involves forming a plurality of metal bumps 11 on electrode pads 12 of a chip 13, forming a plurality of presoldered bumps 14 (made of a solder material) on electrically connecting pads 15 of a circuit board 16, reflowing the presoldered bumps 14 at a reflow temperature such that the presoldered bumps 14 and the corresponding metal bumps 11 together form solder joints 17, and disposing an underfill material 18 beneath the chip 13 so as to ensure the integrity and reliability of the electrical connection between the chip 13 and the circuit board 16.

To enhance electrical performance of an electronic device, it is necessary to install passive components, such as resistors, capacitors, and inductors, in the electronic device. In general, the passive components are mounted on a circuit board by surface mount technology (SMT), and thus presoldered bumps and surface-mounted soldered components are found on the circuit board concurrently, with a difference between both in terms of the height and size of a presolder material formed.

Afterward, during an encapsulation process performed on the circuit board, semiconductor chip, and passive component, it is necessary to implant a plurality of solder balls beneath the circuit board so as to electrically connect the circuit board with any external electronic device. To mount the solder balls on circuit board efficiently, it is necessary to form a presolder material on the electrically connecting pads of the circuit board so as to allow the solder balls to be mounted on the electrically connecting pads of the circuit board by means of the presolder material.

A presolder material is usually formed on electrically connecting pads of a circuit board by electroplating. FIGS. 2A-2F are cross-sectional views showing a conventional method for electroplating a solder material onto electrically connecting pads of a circuit board.

Figure 2A:
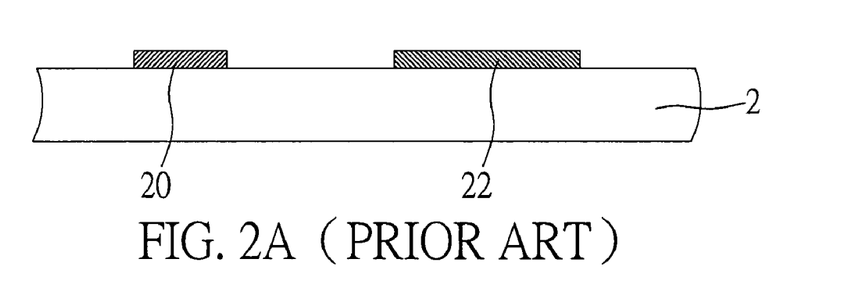
FIGS. 2A-2F (PRIOR ART) are cross-sectional views showing a conventional method for depositing a metal and a solder material onto electrically connecting pads of a circuit board by electroplating.

As shown in FIG. 2A, the conventional method comprises: providing a circuit board 2 having a surface formed with a plurality of first electrically connecting pads 20 and second electrically connecting pads 22 of different sizes, wherein the surface of the circuit board 2 is formed with a circuit structure (not shown), the first electrically connecting pads 20 are, for example, presoldered bump pads intended to be connected to a flip chip, and the second electrically connecting pads 22 are, for example, surface-mounted (SMT) pads for connection with passive components or ball pads for ball implantation. The first and second electrically connecting pads 20 and 22 are formed on either the same surface or different surfaces of the circuit board 2.

Figure 2B:
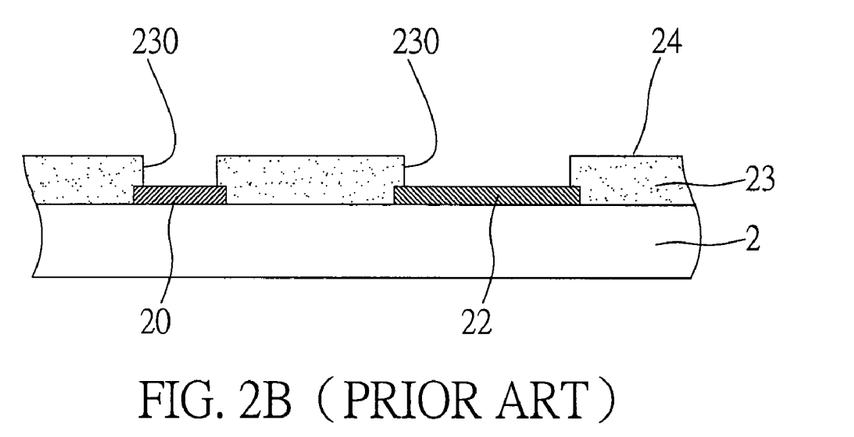

As shown in FIG. 2B, the conventional method further comprises forming an insulated protecting layer 23 on the circuit board 2, forming in the insulated protecting layer 23 a plurality of openings 230 for exposing the first and second electrically connecting pads 20 and 22 on the circuit board 2.

Figure 2C:
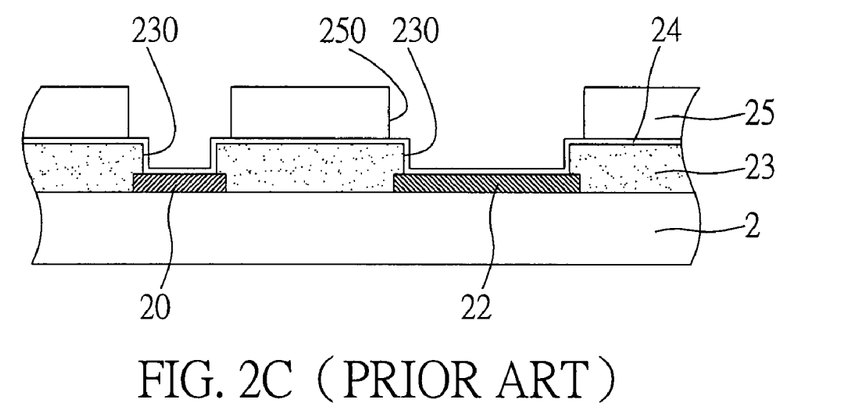

As shown in FIG. 2C, the conventional method further comprises forming a conductive layer 24 on the insulated protecting layer 23 and the openings 230 thereof, forming a resist 25 on the conductive layer 24, forming in the resist 25 a plurality of openings 250 corresponding in position to the openings 230 of the insulated protecting layer 23 and exposing the conductive layer 24 on the first and second electrically connecting pads 20 and 22.

Figure 2D:
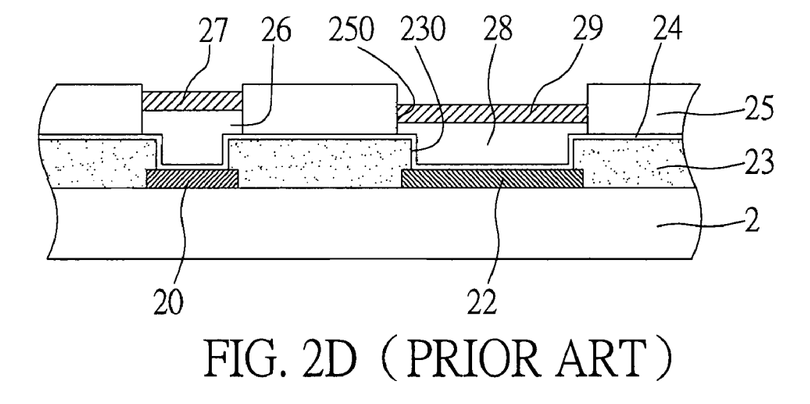

As shown in FIG. 2D, the conventional method further comprises electroplating metal bumps 26 and a presolder material 27 onto the first electrically connecting pads 20 in sequence, electroplating metal bumps 28 and a presolder material 29 onto the second electrically connecting pads 22 in sequence, using the conductive layer 24 as an electrical conduction path.

Figure 2E:
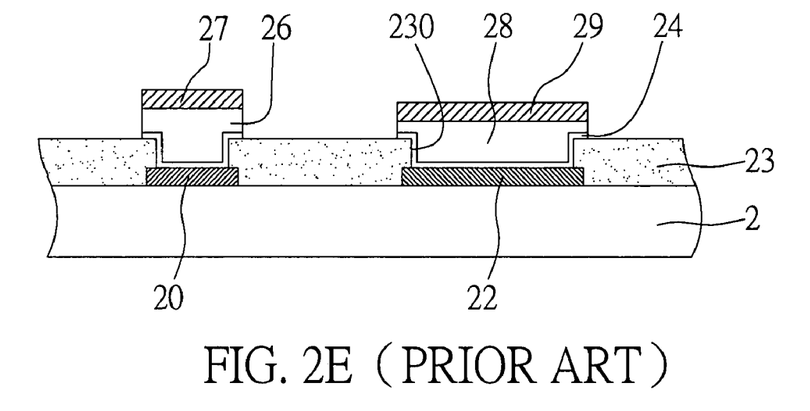

As shown in FIG. 2E, the conventional method further comprises removing the resist 25 and the conductive layer 24 thereunder.

Figure 2F:
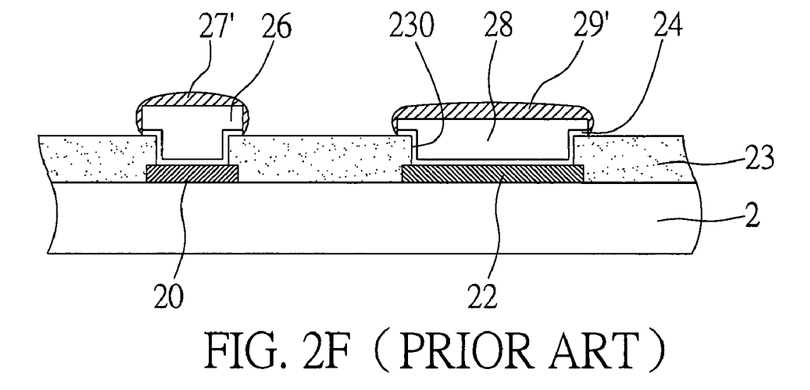

As shown in FIG. 2F, the conventional method further comprises performing a reflow process on the presolder materials 27 and 29 at a melting temperature thereof such that solder structures 27' and 29' of different heights and sizes are formed on the first and second electrically connecting pads 20 and 22, wherein the solder structure 27' of a relatively great height functions as a presoldered bump for mounting a semiconductor chip, and the solder structure 29' of a relatively small height is to be mounted with a passive component, such as a surface-mounted device, or is to be implanted with solder balls.

Although the aforesaid conventional process enables the metal bumps 26 and 28 and the solder materials 27 and 29 to be formed on the first and second electrically connecting pads 20 and 22 with different sizes on the circuit board 2, the relatively large-sized second electrically connecting pads 22 are formed with the metal bumps 28 of a considerable height; as a result, whatever presolder materials subsequently formed on the metal bumps 28 are too high, thus allowing an overflow or shift to occur to the solder materials on the second electrically connecting pads 22 during a subsequent reflow process, and compromising the quality and reliability of the solder materials. In consequence, the reliability of a subsequent process of mounting passive components on the electrically connecting pads of the circuit board or a subsequent ball implantation process is affected to a great extent.

In addition to poor quality and reliability of the solder materials of a circuit board, the prior art does have another drawback, that is, the fine pitch requirements for the electrically connecting pads of high-level electronic products cannot be met.

Accordingly, an issue calling for immediate solution involves developing a method for manufacturing an electrically connecting terminal structure for a circuit board so as to solve the drawbacks of the prior art, that is, poor quality of the solder materials fabricated by a reflow process and failure to meet the fine pitch requirements.

SUMMARY OF THE INVENTION

In light of the aforesaid drawbacks of the prior art, it is a primary objective of the present invention to disclose an electrically connecting terminal structure of a circuit board and a manufacturing method of the structure so as to prevent an overflow and shift of a solder material on electrically connecting pads and thereby enhance the quality of the electrically connecting terminal structure of the circuit board.

Another objective of the present invention is to disclose an electrically connecting terminal structure of a circuit board and a manufacturing method of the structure so as to form a conductive structure on fine-pitch electrically connecting pads.

In order to achieve the above and other objectives, the present invention discloses an electrically connecting terminal structure of a circuit board. The electrically connecting terminal structure comprises: first and second electrically connecting pads formed in first and second predetermined areas defined on a circuit board, the second electrically connecting pad formed in a pad-covered portion of the second predetermined area; an insulated protecting layer formed on a surface of the circuit board and formed with openings for exposing the first electrically connecting pad, the second electrically connecting pad, and a pad-uncovered portion of the second predetermined area, wherein the pad-uncovered portion of the second predetermined area is not formed with and covered by the second electrically connecting pad; first metals formed on the first electrically connecting pad, the second electrically connecting pad, and the pad-uncovered portion of the second predetermined area; and second metals formed on the first metals.

The first metals are metal bumps, and the second metals are made of a solder material. The reflow process is performed on the second metals to form solder structures. The first electrically connecting pad is a presoldered bump pad, and the second electrically connecting pad is a surface-mounted (SMT) electrically connecting pad or a ball pad.

The present invention further discloses a method for manufacturing an electrically connecting terminal structure of a circuit board. The method comprises the steps of: providing a circuit board having at least one surface defined with first and second predetermined areas, the first predetermined area being formed with first electrically connecting pad and the second predetermined area with the second electrically connecting pad, wherein the second electrically connecting pad is formed in a pad-covered portion of the second predetermined area; forming an insulated protecting layer on a surface of the circuit board, forming in the insulated protecting layer openings for exposing the first electrically connecting pad, the second electrically connecting pad, and a pad-uncovered portion of the second predetermined area, wherein the pad-uncovered portion of the second predetermined area is not formed with and covered by the second electrically connecting pad; forming a conductive layer on the insulated protecting layer and the openings thereof; forming a resist on the conductive layer, forming in the resist openings corresponding in position to the openings of the insulated protecting layer; forming in the openings of the resist first metals corresponding in position to the first electrically connecting pad, the second electrically connecting pad, and the pad-uncovered portion of the second predetermined area; and forming second metals on the first metals.

The method further comprises the steps of: removing the resist and the conductive layer thereunder, wherein the first metals are metal bumps, and the second metals are a solder material; and performing a reflow process on the second metals so as to form solder structures.

A method for manufacturing the first electrically connecting pad and the second electrically connecting pad comprises the steps of: forming a patterning-specific resist on the circuit board defined with the first predetermined area and the second predetermined area, forming in the resist openings for exposing the first predetermined area in whole and the second predetermined area in part; and forming the first and second electrically connecting pads in the wholly exposed first predetermined area and the partly exposed second predetermined area respectively.

The method for manufacturing the first electrically connecting pad and the second electrically connecting pad further comprises the steps of: removing the resist; and forming a circuit structure in the openings of the resist.

Unlike the prior art, the present invention discloses a method for manufacturing an electrically connecting terminal structure of a circuit board, and the method mainly involves forming, in addition to a first electrically connecting pad in a first predetermined area, a second electrically connecting pad solely in a portion of a second predetermined area, then, during a subsequent bump process performed on the circuit board, forming first and second metals on the first electrically connecting pad, and forming the first and second metals on the second electrically connecting pad and a pad-uncovered portion of the second predetermined area, so as to reduce the height of the first and second metals subsequently formed by electroplating and enhance the quality of the solder structure formed on the second electrically connecting pad by a subsequent reflow process. As a result, the present invention solves a drawback of the prior art, that is, poor quality of an electrically connecting terminal structure of a circuit board due to an overflow or shift of the solder material, problems about the mounting of passive components and ball implantation, and failure to meet fine-pitch requirements for electrically connecting pads.

DETAILED DESCRIPTION OF THE PREFERRED EMBODIMENT

The following specific embodiment is provided to illustrate the present invention. Persons skilled in the art can readily gain an insight into other advantages and features of the present invention based on the contents disclosed in this specification.

Referring to FIGS. 3A-3J, which are cross-sectional views showing an electrically connecting terminal structure of a circuit board and a method for manufacturing the structure in accordance with the present invention.

Figure 3A:
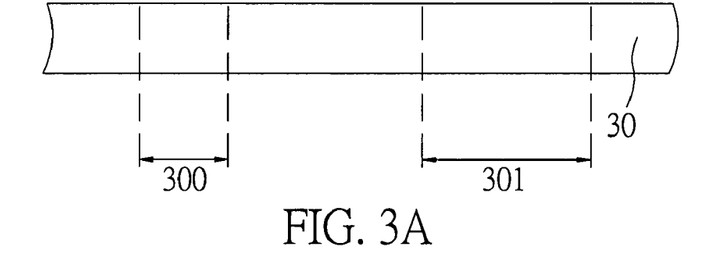
FIGS. 3A-3J are cross-sectional views showing an electrically connecting terminal structure of a circuit board and a method for manufacturing the structure in accordance with the present invention.

As shown in FIG. 3A, the method comprises providing at least one circuit board 30, wherein a surface of the circuit board 30 is defined with a first predetermined area 300 and a second predetermined area 301 for forming an electrically connecting pad.

Figure 3B:
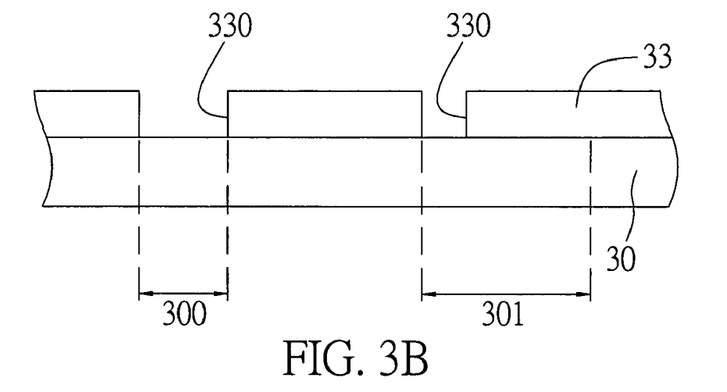

As shown in FIG. 3B, the method further comprises: forming a resist 33 on the circuit board 30, wherein the resist 33 can be a photoresist, such as a dry film photoresist and a liquid photoresist, formed on the circuit board 30 by stencil printing, spin coating, or lamination; patterning the resist 33 by exposure and development so as to form a plurality of openings 330 in the resist 33, wherein the openings 330 correspond in position to the first and second predetermined areas 300 and 301 on the circuit board 30 respectively, the first predetermined area 300 is wholly exposed through one of the openings 330, and the second predetermined area 301 is partly exposed through one of the openings 330.

Figure 3C:
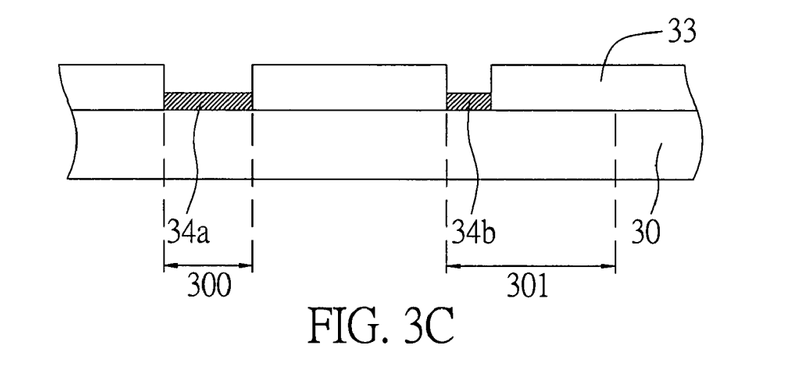

As shown in FIG. 3C, the method further comprises forming the first and second electrically connecting pads 34a and 34b in the wholly exposed first predetermined area 300 and the partly exposed second predetermined area 301 respectively, wherein the first electrically connecting pad 34a is a presoldered bump pad, and the second electrically connecting pad 34b is a surface-mounted (SMT) electrically connecting pad or a ball pad.

Figure 3D:
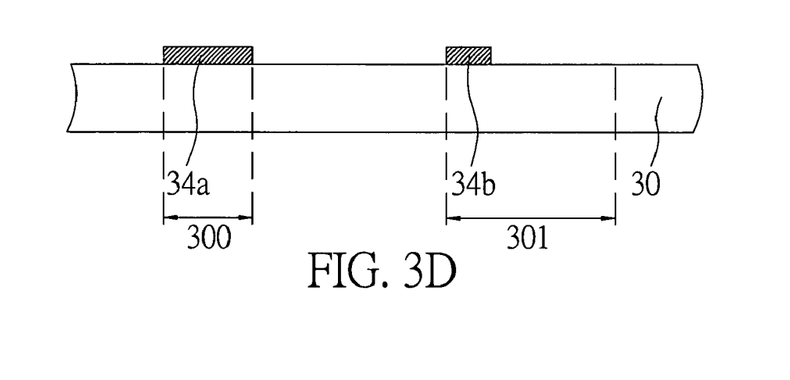

As shown in FIG. 3D, the method further comprises removing the resist 33. The process of removing the resist 33 is known to persons of skill in the art and therefore is not reiterated herein. The first electrically connecting pad 34a and the second electrically connecting pad 34b are made of one selected from the group consisting of lead, tin, silver, copper, gold, bismuth, antimony, zinc, nickel, zirconium, magnesium, indium, tellurium, and gallium. Preferably, the first electrically connecting pad 34a and the second electrically connecting pad 34b are made of copper, because copper is a good, low-cost electroplating material. Forming the first electrically connecting pad 34a and the second electrically connecting pad 34b by electroplating may accompany forming a plurality of conductive circuit structures (not shown). Existing processes of forming conductive circuit structures and electrically connecting pads on a circuit board are complex, numerous, and known to persons of skill in the art and therefore are not reiterated herein.

Figure 3E:
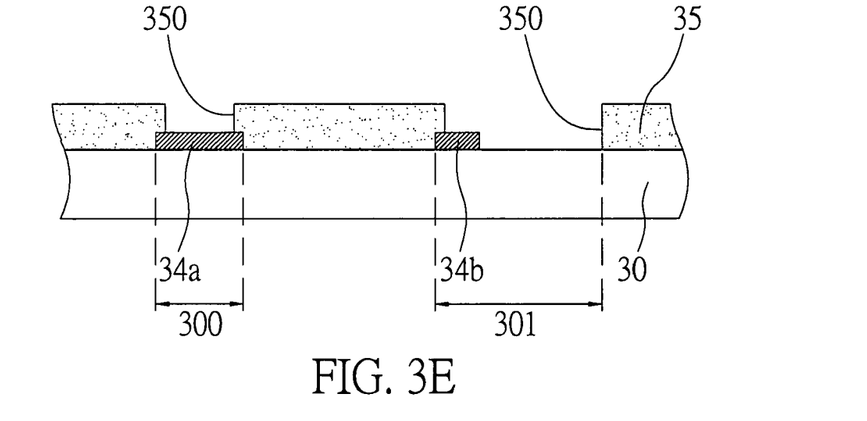

As shown in FIG. 3E, the method further comprises forming an insulated protecting layer 35 on the circuit board 30 having the first electrically connecting pad 34a and the second electrically connecting pad 34b formed thereon. In this embodiment, the insulated protecting layer 35 is coated on a surface of the circuit board 30 by stencil printing, spin coating, or lamination. Then, the method further comprises forming openings 350 in the insulated protecting layer 35 by patterning such that the first electrically connecting pad 34a, the second electrically connecting pad 34b, and the second predetermined area 301 are wholly exposed through the openings 350. The insulated protecting layer 35 is made of a material including, but not limited to, a solder mask material characterized by dewetting, such as a resin-based solder mask.

Figure 3F:
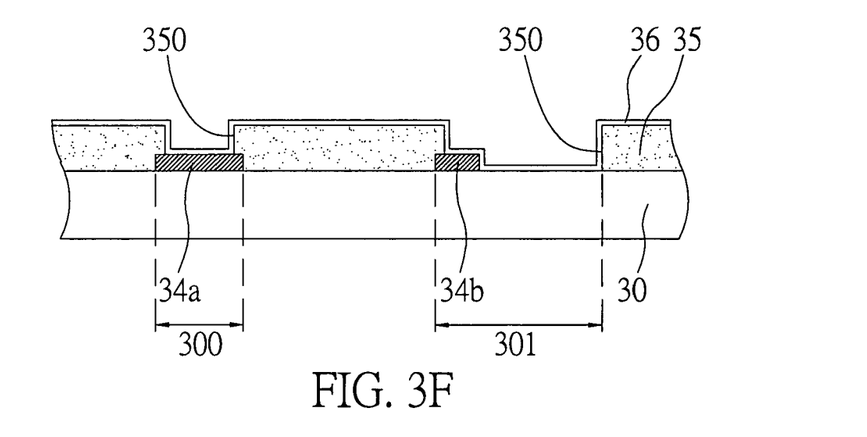

As shown in FIG. 3F, the method further comprises forming a conductive layer 36 on the insulated protecting layer 35 and the openings 350 thereof, wherein the conductive layer 36 functions as an electrical conduction path required for an electroplating metal described below, and the conductive layer 36 is made of a metal, an alloy, a plurality of deposited metal layers, or a conductive polymer.

Figure 3G:
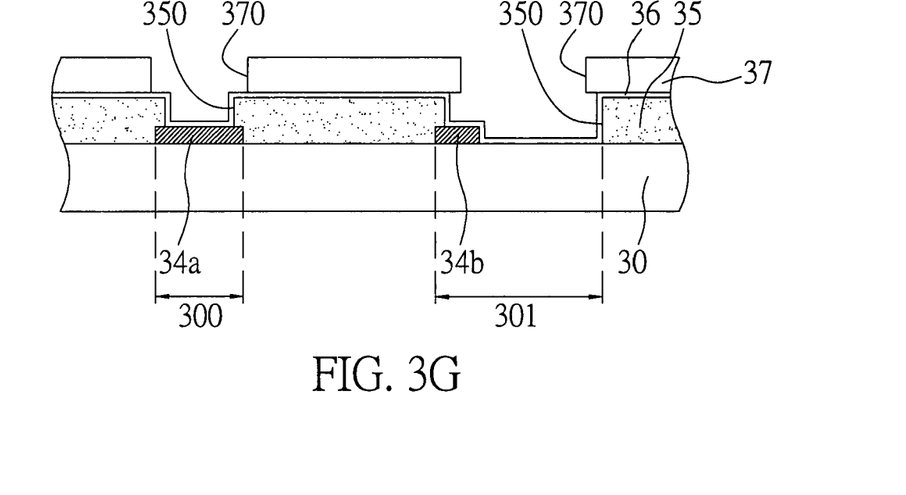

As shown in FIG. 3G, the method further comprises forming a resist 37 on the circuit board 30, wherein the resist 37 can be a photoresist, such as a dry film photoresist and a liquid photoresist, formed on the conductive layer 36 by stencil printing, spin coating, or lamination; patterning the resist 37 by exposure and development so as to cover a portion of the conductive layer 36 by the resist 37 and form a plurality of openings 370 in the resist 37, wherein the openings 370 of the resist 37 correspond in position to the openings 350 of the insulated protecting layer 35, and one of the openings 370 of the resist 37 corresponding in position to the second electrically connecting pad 34b is smaller than one of the openings 350 of the insulated protecting layer 35 corresponding in position to the second electrically connecting pad 34b.

Figure 3H:
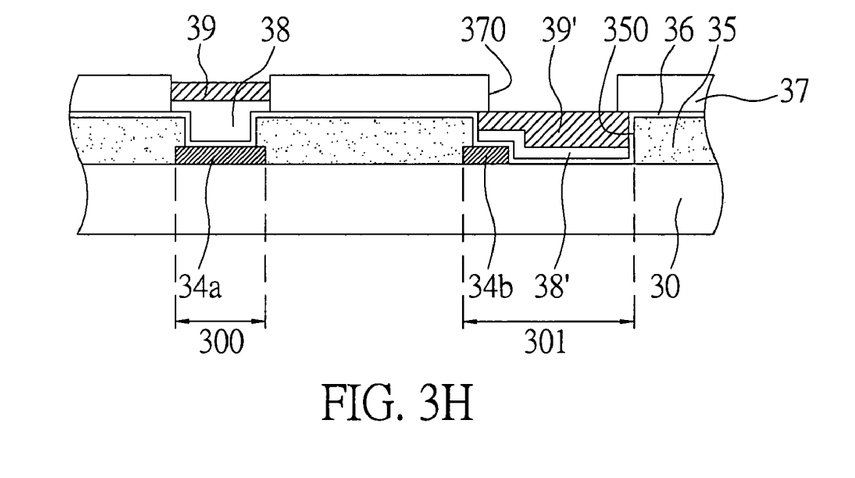

As shown in FIG. 3H, the method further comprises electroplating first metals 38 and 38', such as metal bumps, on the first electrically connecting pad 34a, the second electrically connecting pad 34b, and a pad-uncovered portion of the second predetermined area 301 (not covered with the second electrically connecting pad 34b) in the openings 370, wherein the conductive layer 36 functions as the electrical conductive path; electroplating second metals 39 and 39', such as a solder material, on the first metals 38 and 38', wherein the first metals 38 and 38' are one selected from the group consisting of lead, tin, silver, copper, gold, bismuth, antimony, zinc, nickel, zirconium, magnesium, indium, tellurium, and gallium. Preferably, the first metals 38 and 38' are copper, because copper is a good, low-cost electroplating material. The second metals 39 and 39' are one selected from the group consisting of lead, tin, silver, copper, gold, bismuth, antimony, zinc, nickel, zirconium, magnesium, indium, tellurium, and gallium. Given favorable process conditions, it is feasible to form the second metals 39 and 39' in the openings 370 by stencil printing. The first metal 38 formed on the first electrically connecting pad 34a is higher than the insulated protecting layer 35. The first metal 38' formed on the second electrically connecting pad 34b is not higher than the insulated protecting layer 35. As a result, the height of the second metal 39' subsequently formed on the first metal 38' is reduced.

As disclosed in this embodiment, the method comprises forming, in addition to the first electrically connecting pad 34a in the first predetermined area 300, the second electrically connecting pad 34b solely in a portion, rather than the whole, of the second predetermined area 301, and electroplating the first metal 38', such as a metal bump, on the second electrically connecting pad 34b and the second predetermined area 301, so as to reduce the height of the second metal 39', such as a solder material, subsequently formed on the first metal 38' by electroplating.

Figure 3I:
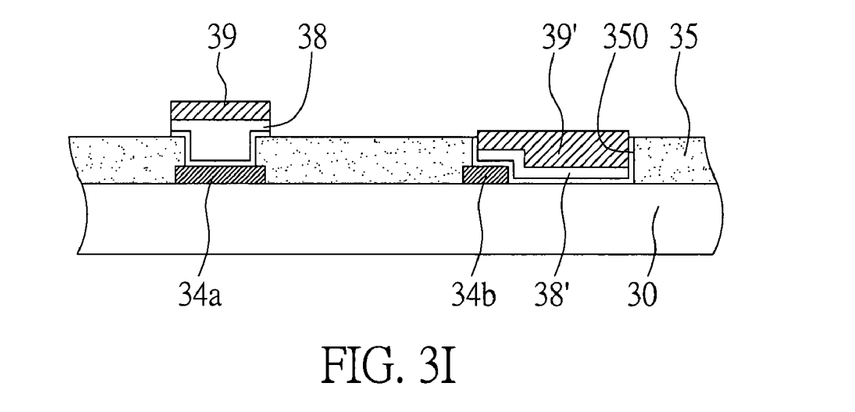

As shown in FIG. 3I, the method further comprises removing, by stripping and etching, the resist 37 and the conductive layer 36 covered by the resist 37. The process of removing the resist 37 and the conductive layer 36 by stripping and etching is known to persons of skill in the art and therefore is not reiterated herein.

Figure 3J:
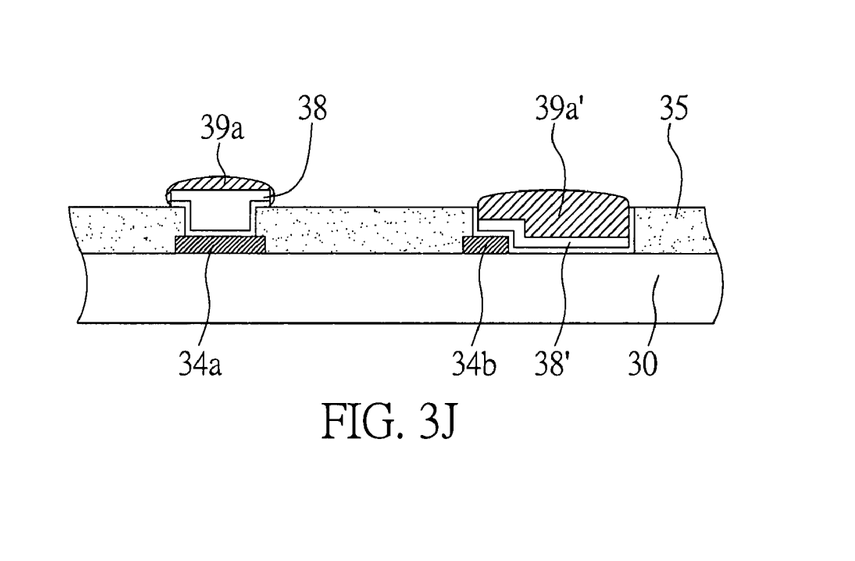

As shown in FIG. 3J, the method further comprises performing a reflow process on the second metals 39 and 39', such as the solder material, at a melting temperature thereof, so as to form solder structures 39a and 39a' on the first and second electrically connecting pads 34a and 34b, wherein the extent to which the second metals 39 and 39' are melted is adjusted in light of the intended height of the solder structures 39a and 39a', so as to adjust an error of height, with a view to forming on the first and second electrically connecting pads 34a and 34b the solder structures 39a and 39a' of different heights and sizes. The solder structure 39a of a relatively great height functions as a presoldered bump for mounting a semiconductor chip, and the solder structure 39a' of a relatively small height is to be mounted with a passive component, such as a surface-mounted device, or is to be implanted with solder balls.

In short, a method for manufacturing an electrically connecting terminal structure of a circuit board mainly comprises forming a first electrically connecting pad 34a on a surface of a circuit board 30, forming a second electrically connecting pad 34b on a portion of a second predetermined area 301, forming a first metal 38 on the first electrically connecting pad 34a, forming a first metal 38' on the second electrically connecting pad 34b and a pad-uncovered portion of the second predetermined area 301 wherein the pad-uncovered portion of the second predetermined area 301 is not covered by the second electrically connecting pad 34b, so as to reduce the height of a second metal 39' subsequently formed on the second electrically connecting pad 34b by electroplating, enhance the quality of a solder structure subsequently formed on the second electrically connecting pad 34b by a reflow process. As a result, the present invention solves a drawback of the prior art, that is, poor quality of an electrically connecting terminal structure of a circuit board due to an overflow or shift of a solder material, problems about the mounting of passive components and ball implantation, and failure to meet fine-pitch requirements for electrically connecting pads.

The aforesaid embodiment merely serves as the preferred embodiment of the present invention. The aforesaid embodiment should not be construed as to limit the scope of the present invention in any way. Hence, any other changes can actually be made in the present invention. It will be apparent to those skilled in the art that all equivalent modifications or changes made to the present invention, without departing from the spirit and the technical concepts disclosed by the present invention, should fall within the scope of the appended claims.

What is claimed is:

1. An electrically connecting terminal structure of a circuit board, the structure comprising:
    first and second electrically connecting pads formed in first and second predetermined areas defined on the circuit board, wherein the second electrically connecting pad is formed in a pad-covered portion of the second predetermined area;
    an insulated protecting layer formed on a surface of the circuit board and formed with openings for exposing the first electrically connecting pad, the second electrically connecting pad, and a pad-uncovered portion of the second predetermined area, wherein the pad-uncovered portion of the second predetermined area is not covered by the second electrically connecting pad;
    first metals formed on the first electrically connecting pad, the second electrically connecting pad, and the pad-uncovered portion of the second predetermined area;
    second metals formed on the first metals; and
    wherein one of the first metals formed on the first electrically connecting pad is higher than the insulated protecting layer, and one of the first metals formed on the second electrically connecting pad is not higher than the insulated protecting layer.

2. The structure of claim 1, wherein the first metals are metal bumps, and the second metals are made of a solder material.

3. The structure of claim 2, wherein a reflow process is performed on the second metals to form solder structures.

4. The structure of claim 1, further comprising a conductive layer formed on the openings of the insulated protecting layer.

5. The structure of claim 1, wherein the first electrically connecting pad is a presoldered bump pad.

6. The structure of claim 1, wherein the second electrically connecting pad is one of a surface-mounted (SMT) electrically connecting pad and a ball pad.

7. A method for manufacturing an electrically connecting terminal structure of a circuit board, the method comprising the steps of:
    providing a circuit board having at least one surface defined with first and second predetermined areas;
    forming a first electrically connecting pad in the first predetermined area;
    forming a second electrically connecting pad in the second predetermined area, wherein the second electrically connecting pad is formed in a pad-covered portion of the second predetermined area;
    forming an insulated protecting layer on a surface of the circuit board;
    forming openings on the insulated protecting layer for exposing the first electrically connecting pad, the second electrically connecting pad, and a pad-uncovered portion of the second predetermined area, wherein the pad-uncovered portion of the second predetermined area is not covered by the second electrically connecting pad;
    forming a conductive layer on the insulated protecting layer and the openings of the insulated protecting layer;
    forming a first resist on the conductive layer;
    forming openings on the first resist corresponding in position to the openings of the insulated protecting layer;
    forming first metals on the first electrically connecting pad in the openings of the first resist, the second electrically connecting pad, and the pad-uncovered portion of the second predetermined area;
    forming second metals on the first metals; and
    wherein one of the first metals formed on the first electrically connecting pad is higher than the insulated protecting layer, and one of the first metals formed on the second electrically connecting pad is not higher than the insulated protecting layer.

8. The method of claim 7, further comprising the step of removing the resist and the conductive layer thereunder.

9. The method of claim 7, wherein the first metals are metal bumps, and the second metals are made of a solder material.

10. The method of claim 9, further comprising the step of performing a reflow process on the second metals so as to form solder structures.

11. The method of claim 7, wherein the first electrically connecting pad is a presoldered bump pad.

12. The method of claim 7, wherein the second electrically connecting pad is one of a surface-mounted (SMT) electrically connecting pad and a ball pad.

13. The method of claim 7, wherein the step of forming the first electrically connecting pad and the second electrically connecting pad comprises the steps of:

forming a second resist on the circuit board defined with the first predetermined area and the second predetermined area;

forming openings on the second resist for exposing whole surface of the first predetermined area and a part of surface of the second predetermined area; and forming the first electrically connecting pad on the first predetermined area exposed in the openings of the second resist and forming the second electrically connecting pad on a part of the second predetermined area exposed in the openings of the second resist.

14. The method of claim 13, further comprising the step of forming a circuit structure in the openings of the second resist.

15. The method of claim 13, further comprising the step of removing the second resist.

16. The method of claim 7, wherein one of the openings of the first resist corresponding in position to the second electrically connecting pad is smaller than one of the openings of the insulated protecting layer.

* * * * *